(12) United States Patent
Rouvala et al.

(10) Patent No.: US 10,283,281 B2
(45) Date of Patent: May 7, 2019

(54) APPARATUS AND METHODS FOR ELECTRICAL ENERGY HARVESTING AND/OR WIRELESS COMMUNICATION

(75) Inventors: Markku Antti Kyösti Rouvala, Helsinki (FI); Tapani Von Rauner, Helsinki (FI); Olli Juhani Luukkonen, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/420,936

(22) PCT Filed: Aug. 15, 2012

(86) PCT No.: PCT/IB2012/054161
§ 371 (c)(1),
(2), (4) Date: Feb. 11, 2015

(87) PCT Pub. No.: WO2014/027220
PCT Pub. Date: Feb. 20, 2014

(65) Prior Publication Data
US 2015/0255226 A1 Sep. 10, 2015

(51) Int. Cl.
*H01G 4/30* (2006.01)
*H01G 11/22* (2013.01)
(Continued)

(52) U.S. Cl.
CPC ............ *H01G 11/22* (2013.01); *H01G 11/08* (2013.01); *H01G 11/56* (2013.01); *H01G 11/70* (2013.01);
(Continued)

(58) Field of Classification Search
CPC ................. H01G 4/224; H01G 4/30
(Continued)

(56) References Cited

U.S. PATENT DOCUMENTS 1,119,732 A 12/1914 Tesla
2004/0155634 A1 8/2004 Sasaki
(Continued)

FOREIGN PATENT DOCUMENTS

CN 201465157 U 5/2010
DE 10 2004 053938 A1 5/2006
(Continued)

OTHER PUBLICATIONS

Pelissier, M., Jantunen, J., Gomez, B., Arponen, J., Masson, G., Dia, S., Varteva, J., Gary, M., "A 112 Mb/s Full Duplex Remotely-Powered Impulse-UWB RFID Transceiver for Wireless NV-Memory Applications", Solid-State Circuits, IEEE Journal of, vol. 46, No. 4, pp. 916-927, (Apr. 2011).
(Continued)

*Primary Examiner* — Stanley Tso
(74) *Attorney, Agent, or Firm* — Harrington & Smith

(57) ABSTRACT

Apparatus including an electric double layer capacitor having a first surface and a second surface, the first surface being opposite the second surface; a first conductor positioned adjacent the first surface and configured to function as a current collector for the electric double layer capacitor, and having a first electrical length to resonate in a first operational frequency band; and a second conductor positioned adjacent the second surface and configured to function as a current collector for the electric double layer capacitor.

14 Claims, 5 Drawing Sheets

(51) Int. Cl.
  *H01G 11/08* (2013.01)
  *H01Q 9/27* (2006.01)
  *H01G 11/70* (2013.01)
  *H01G 11/74* (2013.01)
  *H01G 11/56* (2013.01)
  *H01G 11/84* (2013.01)
  *H05K 1/02* (2006.01)
  *H05K 1/18* (2006.01)
  *H01G 11/66* (2013.01)

(52) U.S. Cl.
  CPC ............ *H01G 11/74* (2013.01); *H01G 11/84* (2013.01); *H01Q 9/27* (2013.01); *H05K 1/0242* (2013.01); *H05K 1/189* (2013.01); *H01G 11/66* (2013.01); *Y02E 60/13* (2013.01); *Y10T 29/417* (2015.01)

(58) Field of Classification Search
  USPC .......................................... 361/301.1–301.5
  See application file for complete search history.

(56) References Cited

U.S. PATENT DOCUMENTS

| | | | |
|---|---|---|---|
| 2005/0034668 A1* | 2/2005 | Garvey et al. | 118/723 R |
| 2005/0237247 A1* | 10/2005 | Kinnunen | H01Q 1/243 343/702 |
| 2007/0258188 A1* | 11/2007 | Shiue | B60K 6/28 361/266 |
| 2008/0079565 A1 | 4/2008 | Koyama | 340/539.12 |
| 2008/0156886 A1 | 7/2008 | Tsuchiya | 235/492 |
| 2009/0228074 A1* | 9/2009 | Edgell | A61N 1/37229 607/60 |
| 2010/0019908 A1* | 1/2010 | Cho | G06K 19/07749 340/572.7 |
| 2010/0090909 A1* | 4/2010 | Ella | 343/702 |
| 2010/0194498 A1* | 8/2010 | Isoshima | 333/185 |
| 2011/0155634 A1 | 6/2011 | Lomas et al. | |
| 2011/0253989 A1* | 10/2011 | Ullmann et al. | 257/40 |
| 2011/0256455 A1* | 10/2011 | Coowar | H01G 9/02 429/247 |
| 2011/0304305 A1 | 12/2011 | Rouvala et al. | 320/167 |
| 2012/0025787 A1 | 2/2012 | Rouvala et al. | 320/166 |
| 2012/0062358 A1* | 3/2012 | Nowottnick | G06K 19/07767 340/5.2 |
| 2012/0206302 A1* | 8/2012 | Ramachandran et al. | 343/702 |
| 2012/0265596 A1* | 10/2012 | Mazed | G06Q 30/02 705/14.23 |
| 2013/0016021 A1* | 1/2013 | Blair | H01Q 3/26 343/720 |
| 2013/0176661 A1 | 7/2013 | Rouvala et al. | 361/502 |
| 2014/0028109 A1* | 1/2014 | Simon | H01F 38/14 307/104 |
| 2014/0042230 A1* | 2/2014 | Pueschner | H01Q 1/38 235/492 |
| 2015/0044963 A1* | 2/2015 | Konanur | H01Q 7/00 455/41.1 |

FOREIGN PATENT DOCUMENTS

| | | |
|---|---|---|
| DE | 102010033679 A1 | 2/2012 |
| EP | 1 585 191 A1 | 10/2005 |
| EP | 1 956 524 A2 | 8/2008 |
| WO | WO 2004/061887 A1 | 7/2007 |
| WO | WO 2008/085503 A2 | 7/2008 |
| WO | WO 2010/019961 A2 | 2/2010 |
| WO | WO 2010/127641 A1 | 11/2010 |
| WO | WO 2011/116463 A1 | 9/2011 |
| WO | WO-2012/013998 A1 | 2/2012 |
| WO | WO-2012013998 A1 | 2/2012 |

OTHER PUBLICATIONS

"Printable supercapacitors and Optomec's Printable 5+ Ghz Carbon Nanotubes Thin Film Transistors", Apr. 11, 2009, nextbigfuture.com, 12 pgs.

Lee, Y., "RFID antennas: Microchip—Antenna Circuit Design for RFID applications", AN710, MicroChip Technology Inc., (2003), (50 pages).

Karalis, A., Joannopoulos, J.D. and Soljacic, M. "Efficient wireless non-radiative mid-range energy transfer", Annals of Physics, vol. 323, pp. 34-38 (2008).

Kurs, A., Karalis, A., Moffatt, R., Joannopoulous, J.D., Fisher, P. and M. Soljacic "Wireless power transfer via strong coupled magnetic resonators", Science, vol. 317, pp. 83-86 (2007).

Cannon, B.L., Hoburg, J.F., Stancil, D.D. and Goldstein, S.C. "Magnetic resonant coupling as a potential means for wireless power transfer to multiple small receivers", IEEE Transactions on Power Electronics, vol. 24, No. 7, pp. 1819-1825, (2009).

Sample, A.P., Meyer, D.A., and J.R. Smith, "Analysis, experimental results, and range adaption of magnetically coupled resonators for wireless power transfer", IEEE Transactions on Industrial Electronics, vol. 58, No. 2, pp. 544-554, (2011).

Jantunen, I., Hamalainen, J., Korhonen, T, Kaaja, H, Jantunen, J., Boldyrev, S., System Architecture for Mobile-phone-readable RF Memory Tags. Proceedings of Ubicomm 2010 conference, (2010), (7 pages).

Splashpower wireless charging—http://en.wikipedia.org/wiki/Splashpower, (2001), (2 pages).

Wireless Power Consortium—http://en.wikipedia.org/wiki/Wireless_Power Consortium, (2009), 6 pages).

Wireless Power Solutions—http://www.ti.com/wirelesspower, (3 pages).

NFC wireless charging—http://www.nfcworld.com/technology/wireless-charging/, (2008-2015), (5 pages).

Shen C. W. et al., "A novel three-dimensional micro supercapacitor using self-support nano composite materials", IEEE 24th International Conference on Micro Electro Mechanical Systems, Jan. 23, 2011, pp. 1285-1288.

\* cited by examiner

APPARATUS AND METHODS FOR ELECTRICAL ENERGY HARVESTING AND/OR WIRELESS COMMUNICATION

TECHNOLOGICAL FIELD

Embodiments of the present invention relate to apparatus and methods for electrical energy harvesting and/or wireless communication. In particular, they relate to apparatus in a portable electronic device.

BACKGROUND

Apparatus, such as portable electronic devices, usually include one or more antennas for wireless communication and an electrical energy storage device (such as a lithium ion battery) for providing electrical energy to the apparatus. The data transfer rate and range of the one or more antennas may be constrained by the electrical energy available from the electrical energy storage device. For example, where the one or more antennas are for near field communication (NFC), the data rate and reading distance may be relatively limited due to the available electrical energy.

It would therefore be desirable to provide an alternative apparatus.

BRIEF SUMMARY

According to various, but not necessarily all, embodiments of the invention there is provided apparatus comprising: an electric double layer capacitor having a first surface and a second surface, the first surface being opposite the second surface; a first conductor positioned adjacent the first surface and configured to function as a current collector for the electric double layer capacitor, and having a first electrical length to resonate in a first operational frequency band; and a second conductor positioned adjacent the second surface and configured to function as a current collector for the electric double layer capacitor.

The first operational frequency band may include a near field communication (NFC) frequency band, a Qi frequency band, or a far field frequency band.

The first conductor and the second conductor may be coils having at least one turn.

The apparatus may further comprise a first flexible printed circuit including the first conductor, and a second flexible printed circuit including the second conductor, the electric double layer capacitor being sandwiched between the first flexible printed circuit and the second flexible printed circuit.

The apparatus may further comprise radio frequency circuitry configured to provide signals to, and/or receive signals from, the first conductor.

The apparatus may further comprise charging circuitry configured to charge the electric double layer capacitor via the first conductor and the second conductor.

The second conductor may have a second electrical length to resonate in a second operational frequency band.

The first operational frequency band and the second operational frequency band may at least partially overlap in frequency.

The first operational frequency band and the second operational frequency band may not overlap in frequency.

The apparatus may further comprise radio frequency circuitry configured to provide signals to, and/or receive signals from, the second conductor.

According to various, but not necessarily all, embodiments of the invention there is provided a portable electronic device comprising apparatus as described in any of the preceding paragraphs.

The portable electronic device may be flexible.

According to various, but not necessarily all, embodiments of the invention there is provided a module comprising apparatus as described in any of the preceding paragraphs.

According to various, but not necessarily all, embodiments of the invention there is provided a method comprising: providing an electric double layer capacitor having a first surface and a second surface, the first surface being opposite the second surface; providing a first conductor positioned adjacent the first surface and configured to function as a current collector for the electric double layer capacitor, and having a first electrical length to resonate in a first operational frequency band; and providing a second conductor positioned adjacent the second surface and configured to function as a current collector for the electric double layer capacitor.

The first operational frequency band may include a near field communication (NFC) frequency band, a Qi frequency band, or a far field frequency band.

The first conductor and the second conductor may be coils having at least one turn.

The method may further comprise providing a first flexible printed circuit including the first conductor, and providing a second flexible printed circuit including the second conductor, the electric double layer capacitor being sandwiched between the first flexible printed circuit and the second flexible printed circuit.

The method may further comprise providing radio frequency circuitry configured to provide signals to, and/or receive signals from, the first conductor.

The method may further comprise providing charging circuitry configured to charge the electric double layer capacitor via the first conductor and the second conductor.

The second conductor may have a second electrical length to resonate in a second operational frequency band.

The first operational frequency band and the second operational frequency band may at least partially overlap in frequency.

The first operational frequency band and the second operational frequency band may not overlap in frequency.

The method may further comprise providing radio frequency circuitry configured to provide signals to, and/or receive signals from, the second conductor.

BRIEF DESCRIPTION

For a better understanding of various examples of embodiments of the present invention reference will now be made by way of example only to the accompanying drawings in which.

DETAILED DESCRIPTION

In the following description, the wording 'connect' and 'couple' and their derivatives mean operationally connected or coupled. It should be appreciated that any number or combination of intervening components can exist (including no intervening components). Additionally, it should be appreciated that the connection or coupling may be a physical galvanic connection and/or an electromagnetic connection.

Figure 1:
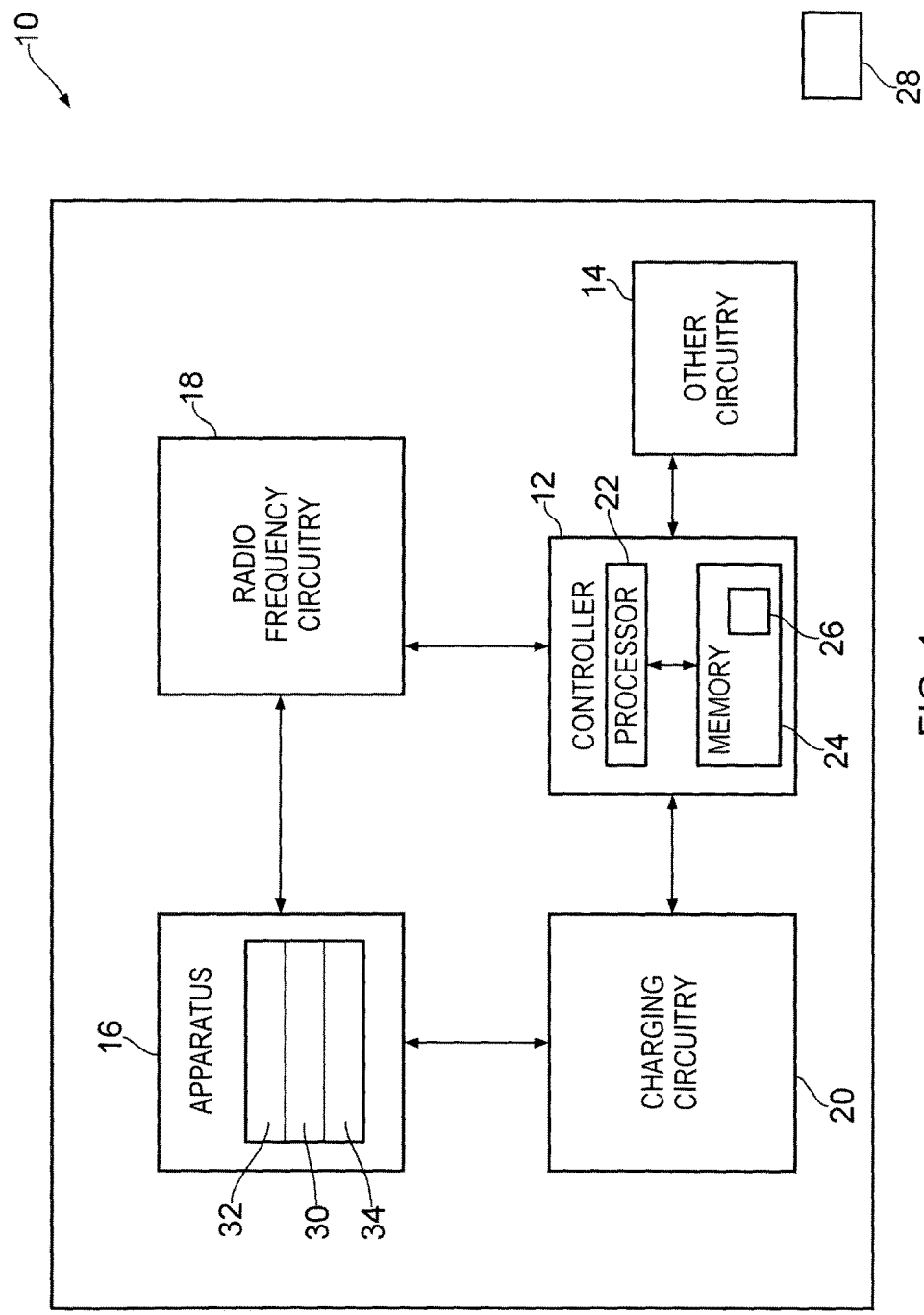
FIG. 1 illustrates a schematic diagram of a portable electronic device according to various embodiments of the invention.

In more detail, FIG. 1 illustrates an electronic device 10 which may be any apparatus such as a portable electronic device (for example, a mobile cellular telephone, a tablet computer, a laptop computer, a personal digital assistant or a hand held computer), a non-portable electronic device (for example, a personal computer or a base station for a cellular network) or a module for such devices. As used here, 'module' refers to a unit or apparatus that excludes certain parts or components that would be added by an end manufacturer or a user. The electronic device 10 may be flexible (that is, pliable in a user's hand) and therefore have a young's modulus that is lower than usual electronic devices.

The electronic device 10 includes a controller 12, other circuitry 14, apparatus 16, radio frequency circuitry 18 and charging circuitry 20. The electronic device 10 may optionally include one or more matching circuits between the apparatus 16 and the radio frequency circuitry 18.

The implementation of the controller 12 can be in hardware alone (for example, a circuit, a processor and so on), have certain aspects in software including firmware alone or can be a combination of hardware and software (including firmware).

The controller 12 may be implemented using instructions that enable hardware functionality, for example, by using executable computer program instructions in a general-purpose or special-purpose processor 22 that may be stored on a computer readable storage medium 24 (disk, memory and so on) to be executed by such a processor 22.

The processor 22 is configured to read from and write to the memory 24. The processor 22 may also comprise an output interface via which data and/or commands are output by the processor 22 and an input interface via which data and/or commands are input to the processor 22.

The memory 24 stores a computer program 26 comprising computer program instructions that control the operation of the electronic device 10 when loaded into the processor 22. The computer program instructions 26 provide the logic and routines that enables the electronic device 10 to perform the methods described in the following paragraphs. The processor 22 by reading the memory 24 is able to load and execute the computer program 26.

The computer program 26 may arrive at the electronic device 10 via any suitable delivery mechanism 28. The delivery mechanism 28 may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 26. The delivery mechanism 28 may be a signal configured to reliably transfer the computer program 26. The electronic device 10 may propagate or transmit the computer program 26 as a computer data signal.

Although the memory 24 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' and so on or a 'controller', 'computer', 'processor' and so on should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code and so on should be understood to encompass software for a programmable processor or firmware such as, for example, the programmable content of a hardware device whether instructions for a processor, or configuration settings for a fixed-function device, gate array or programmable logic device and so on.

As used in this application, the term 'circuitry' refers to all of the following:

(a) hardware-only circuit implementations (such as implementations in only analogue and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The other circuitry 14 includes other electronic components of the electronic device 10. For example, the other circuitry 14 may include a user input device (such as a touch screen display and/or one or more buttons), an audio input device (a microphone for example), an audio output device (a loudspeaker for example), and an electrical energy storage device (a lithium ion battery for example). The controller 12 is configured to control the other circuitry 14 and also receive signals from the other circuitry 14.

The apparatus 16 includes an electric double layer capacitor 30, a first conductor 32 and a second conductor 34. The electric double layer capacitor 30 (which may also be referred to as a supercapacitor, a supercondenser, an electrochemical double layer capacitor, and an ultracapacitor) is configured to store electrical energy and the structure of the electric double layer capacitor 30 is described in more detail in the following paragraphs with reference to FIG. 2.

The first conductor 32 and/or the second conductor 34 may comprise any suitable conductive material and may comprise copper for example. The first conductor 32 and the second conductor 34 may have any suitable shape and may have a spiral shape or a rectangular shape for example. The first conductor 32 and the second conductor 34 share a common area when viewed in plan. The first conductor 32 and the second conductor 34 may be planar or non-planar.

It should be appreciated that in some embodiments, the first conductor 32 and the second conductor 34 may not require one or more turns (for example, where the first and second conductors 32, 34 have a square or a rectangular shape). In these embodiments, self/mutual inductance may be achieved for relatively short conductor lengths (that is, shorter than a coil having turns).

The first conductor 32 and/or the second conductor 34 have an electrical length that causes the first conductor 32 and/or the second conductor 34 to resonate in an operational frequency band. The electrical length of the first conductor 32 and/or the second conductor 34 may include additional matching circuitry that tunes the first conductor 32 and/or the second conductor 34 to resonance. In other words, the first conductor 32 and/or the second conductor 34 may be non-resonant in the desired operational frequency band, but are forced to resonate in the desired operational frequency band by having one or more additional inductor(s) and/or capacitor(s) on the conductor or at the feed to the conductor. The electric double layer capacitor 30 is positioned between the first conductor 32 and the second conductor 34 and the first and second conductors 32, 34 are configured to function as current collectors for the electric double layer capacitor 30.

The radio circuitry 18 is connected between the apparatus 16 and the controller 12 and may include a receiver and/or a transmitter and/or a transceiver. The apparatus 16 and the radio circuitry 18 are configured to operate in one or more operational frequency bands. For example, the operational frequency bands may include (but are not limited to) Long Term Evolution (LTE) 700 (US) (698.0-716.0 MHz, 728.0-746.0 MHz), LTE 1500 (Japan) (1427.9-1452.9 MHz, 1475.9-1500.9 MHz), LTE 2600 (Europe) (2500-2570 MHz, 2620-2690 MHz), amplitude modulation (AM) radio (0.535-1.705 MHz); frequency modulation (FM) radio (76-108 MHz); Bluetooth (2400-2483.5 MHz); wireless local area network (WLAN) (2400-2483.5 MHz); hiper local area network (HLAN) (5150-5850 MHz); global positioning system (GPS) (1570.42-1580.42 MHz); US-Global system for mobile communications (US-GSM) 850 (824-894 MHz) and 1900 (1850-1990 MHz); European global system for mobile communications (EGSM) 900 (880-960 MHz) and 1800 (1710-1880 MHz); European wideband code division multiple access (EU-WCDMA) 900 (880-960 MHz); personal communications network (PCN/DCS) 1800 (1710-1880 MHz); US wideband code division multiple access (US-WCDMA) 1700 (transmit: 1710 to 1755 MHz, receive: 2110 to 2155 MHz) and 1900 (1850-1990 MHz); wideband code division multiple access (WCDMA) 2100 (transmit: 1920-1980 MHz, receive: 2110-2180 MHz); personal communications service (PCS) 1900 (1850-1990 MHz); time division synchronous code division multiple access (TD-SCDMA) (1900 MHz to 1920 MHz, 2010 MHz to 2025 MHz), ultra wideband (UWB) Lower (3100-4900 MHz); UWB Upper (6000-10600 MHz); digital video broadcasting-handheld (DVB-H) (470-702 MHz); DVB-H US (1670-1675 MHz); digital radio mondiale (DRM) (0.15-30 MHz); worldwide interoperability for microwave access (WiMax) (2300-2400 MHz, 2305-2360 MHz, 2496-2690 MHz, 3300-3400 MHz, 3400-3800 MHz, 5250-5875 MHz); digital audio broadcasting (DAB) (174.928-239.2 MHz, 1452.96-1490.62 MHz); radio frequency identification low frequency (RFID LF) (0.125-0.134 MHz); radio frequency identification high frequency (RFID HF) (13.56 MHz); radio frequency identification ultra high frequency (RFID UHF) (433 MHz, 865-956 MHz, 2450 MHz); Wireless Power Consortium's standard for wireless charging Qi (100 kHz).

A frequency band over which an antenna can efficiently operate is a frequency range where the antenna return loss is less than an operational threshold. For example, efficient operation may occur when the apparatus return loss is better than (that is, less than) −4 dB or −6 dB.

The charging circuitry 20 is connected between the apparatus 16 and the controller 12. The charging circuitry 20 is configured to receive electrical energy from an electrical energy storage device 14 (for example) and provide the electrical energy to the electric double layer capacitor 30 to charge the electric double layer capacitor 30. The charging circuitry 20 is also configured to receive electrical energy from the electric double layer capacitor 30 and provide the electrical energy to one or more electronic components of the electronic device 10.

In some embodiments, the radio frequency circuitry 18 is not connected to the apparatus 16 and is instead connected to one or more antennas that are separate to the apparatus 16. In these embodiments, the apparatus 16 is used only for energy harvesting and the one or more other antennas may operate in different frequency bands to the apparatus 16.

Figure 2:
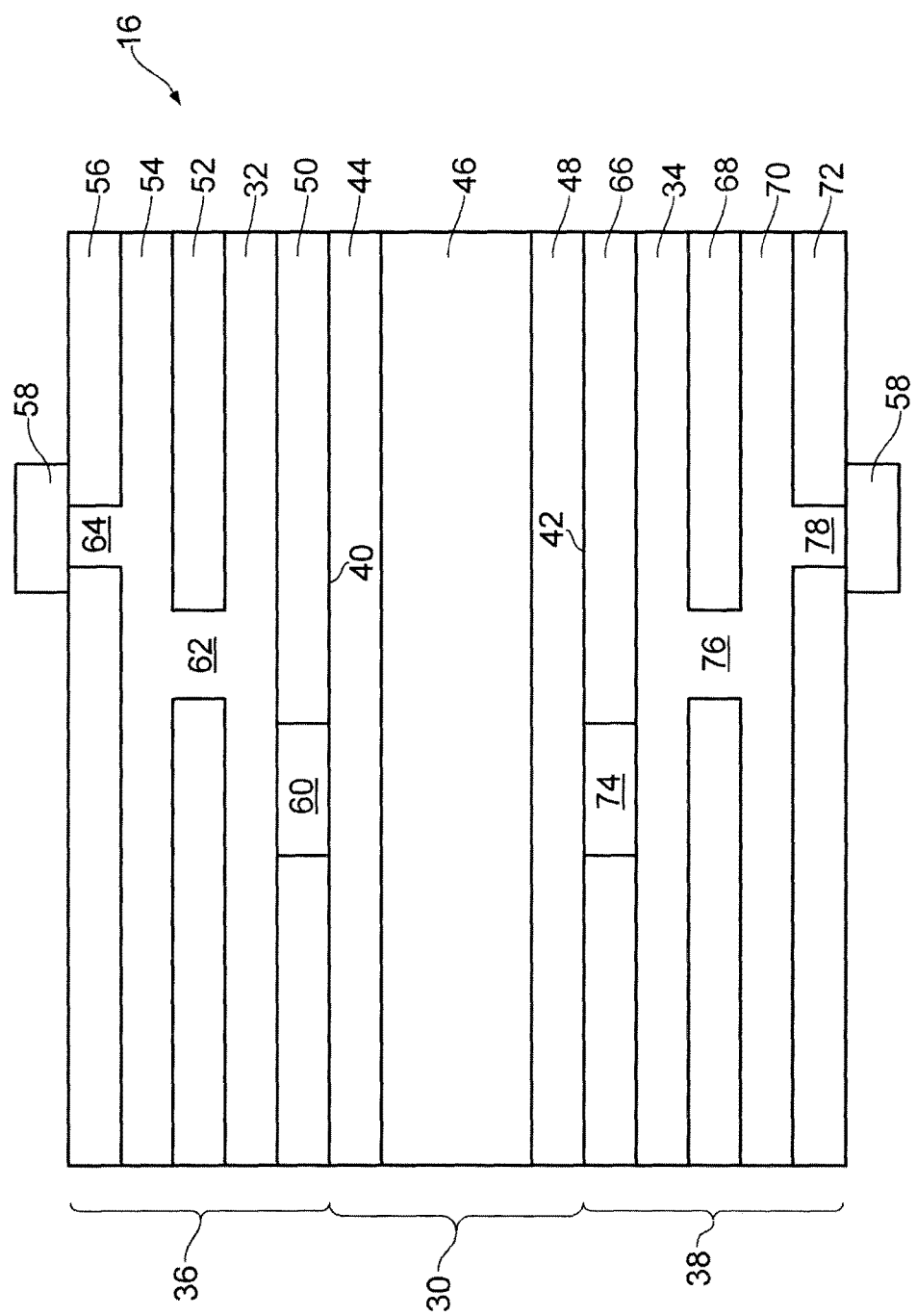
FIG. 2 illustrates a cross section diagram of an apparatus according to various embodiments of the invention.

FIG. 2 illustrates a schematic cross sectional diagram of an apparatus 16 according to various embodiments of the invention. The apparatus 16 includes an electric double layer capacitor 30, a first flexible printed circuit (FPC) 36 and a second flexible printed circuit (FPC) 38. The electric double layer capacitor 30 has a first surface 40 and a second opposite surface 42 and the first flexible printed circuit 36 is positioned adjacent the first surface 40, and the second flexible printed circuit 38 is positioned adjacent the second surface 42. Consequently, the electric double layer capacitor 30 is sandwiched between the first flexible printed circuit 36 and the second flexible printed circuit 38.

The electric double layer capacitor 30 includes a first active carbon layer 44, a separator with electrolyte layer 46 and a second active carbon layer 48. The separator with electrolyte layer 46 is sandwiched between the first active carbon layer 44 and the second active carbon layer 48.

The first flexible printed circuit 36 includes (in laminate order) a first cover layer 50, a first conductor 32, a core layer 52, a conductive layer 54 and a second cover layer 56. The first cover layer 50 is positioned adjacent the first active carbon layer 44 and the second cover layer 56 is arranged to receive circuitry 58 thereon via surface mount technology for example. The first flexible printed circuit 36 additionally includes a carbon connector 60 positioned in the first cover layer 50 that connects the first active carbon layer 44 and the first conductor 32, a first conductive connector 62 for connecting the first conductor 32 and the conductive layer 54, and a second conductive connector 64 for connecting the conductive layer 54 with circuitry 58. The circuitry 58 is connected to the charging circuitry 20 and may also be connected to the radio frequency circuitry 18.

The second flexible printed circuit 38 includes (in laminate order) a first cover layer 66, a first conductor 34, a core layer 68, a conductive layer 70 and a second cover layer 72. The first cover layer 66 is positioned adjacent the second active carbon layer 48 and the second cover layer 72 is arranged to receive circuitry 58 thereon via surface mount technology for example. The second flexible printed circuit 38 additionally includes a carbon connector 74 positioned in the first cover layer 66 that connects the second active carbon layer 48 and the second conductor 34, a first conductive connector 76 for connecting the second conductor 34 and the conductive layer 70, and a second conductive connector 78 for connecting the conductive layer 70 with circuitry 58. The circuitry 58 is connected to the charging circuitry 20 and may also be connected to the radio frequency circuitry 18.

The first conductor 32 and the second conductor 34 function as current collectors of the electric double layer capacitor 30 since they are coupled to the first and second active carbon layers 44, 48 via the carbon connectors 60 and 74 respectively. Additionally, since the first conductor 32 and/or the second conductor 34 have electrical lengths (which may include matching circuitry to tune the first conductor 32 and/or the second conductor 34 to resonance) that enable them to resonate in one or more operational frequency bands, the first conductor 32 and/or the second conductor 34 may operate as an antenna and enable wireless communication in the operational frequency bands.

In some embodiments, one of the first and second conductors 32, 34 may be coupled to the radio frequency circuitry 18 via a feed point (that is, the conductor is a driven antenna) and the other conductor of the first and second conductors 32, 34 is electromagnetically coupled to/from the other conductor of the first and second conductors 32, 34 whilst at least one end of the other conductor is additionally coupled to a ground plane (that is, the other conductor is a parasitic antenna). In other embodiments, the first and second conductors 32, 34 may both be coupled to the radio frequency circuitry 18 via feed points (that is, both conductors 32, 34 are driven antennas). In other embodiments, at least one of the first and second conductors 32, 34 may also be coupled to a ground plane, in addition to being coupled to radio frequency circuitry 18 via one or more feed point.

The first conductor 32 and the second conductor 34 are able to function simultaneously as antennas and as current collectors for the electric double layer capacitor 30 because the frequency domain of operation for the electric double layer capacitor 30 is different to the frequency domain of an antenna since the electric double layer capacitor 30 charges and discharges with ion transport, whereas an antenna functions with resonance of current (electron flow).

The positioning of the electric double layer capacitor 30 between the first conductor 32 and the second conductor 34 reduces capacitive coupling between the first and second conductors 32, 34 because the resonant frequency domain of the electric double layer capacitor 30 is different to that of the first and second conductors 32, 34 in the radio frequency domain. Consequently, the electric double layer capacitor 30 may function as electrical energy storage and not as a high frequency coupling element between the first and second conductors 32, 34. This may advantageously enable the first and second conductors 32, 34 to be positioned relatively close to one another (50 microns apart for example).

Various embodiments of the invention provide an advantage in that the electronic device 10 includes an electric double layer capacitor 30 for supplying electrical energy to improve the wireless data rate and communication distance. Additionally, the electric double layer capacitor 30 may be configured to provide electrical energy to additional circuitry (sensors for example) that are external to the electronic device 10. Consequently, the electric double layer capacitor 30 may function as a power source of a system of devices. Furthermore, since the electric double layer capacitor 30 is sandwiched between the first and second conductors 32, 34, the electrical double layer capacitor 30 may occupy a relatively small volume and therefore not significantly increase the size of the electronic device 10.

Additionally, the apparatus 16 is relatively thin and flexible and is therefore suitable for use in a flexible portable electronic device. Since the first and second conductors 32, 34 are formed in a flexible printed circuit, the apparatus 16 may be relatively simple to manufacture (for example, no soldering may be required) and may be formed using the same manufacturing process as for other components of the electronic device 10 (that is, lamination, etching and printing processes). The apparatus 16 enables energy storage therein without requiring integration of discrete components and the components of the apparatus 16 may be printed or laminated at the same time in a very thin structure.

Furthermore, the first and second conductors 32, 34 may advantageously be used both for collecting radio frequency or inductive energy and transferring data bits wirelessly. Electrical energy can be transferred from a reader or from an antenna, which can be close-by or further away, and the energy transferred will relate to the energy levels received. At the same antenna (such as a spiral NFC-like element), the antenna can transfer data or signals either used for the energy transfer information, or purely for sending some data. This data can be embedded to the power signal or sent between the bursts of sending the power (energy). An apparatus 16 that has a supercapacitor element 30 in itself, can receive energy, store it for itself and communicate with the infrastructure around it. The apparatus 16 may be a full tag or consumer electronics concept that can store energy collected from a device and can also communicate with that same device. The apparatus 16 may consequently provide miniaturization and dual functionality.

Figure 3B:
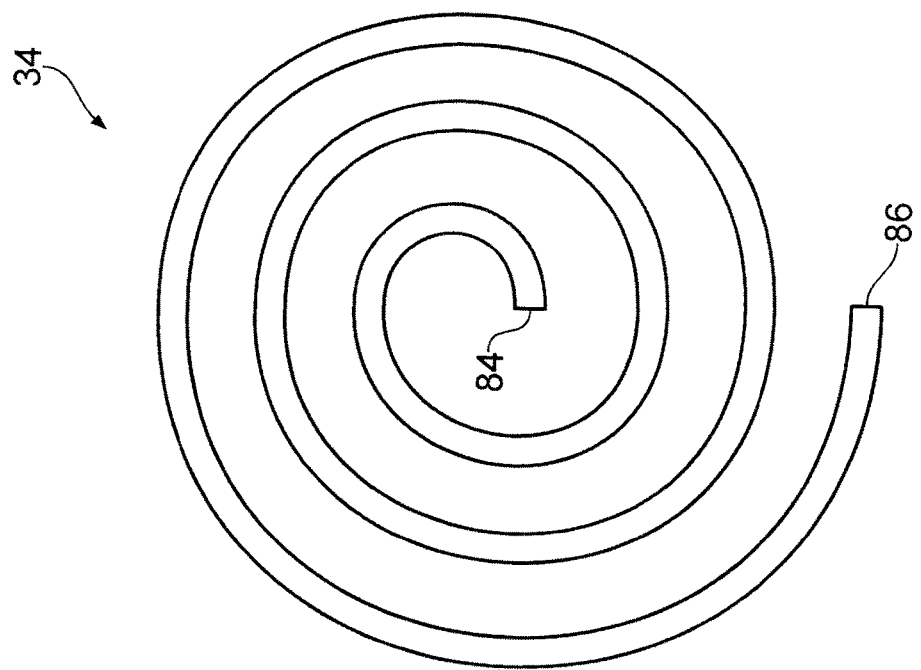
FIG. 3B illustrates a plan view diagram of a second conductor of an apparatus according to various embodiments of the invention.
Figure 3A:
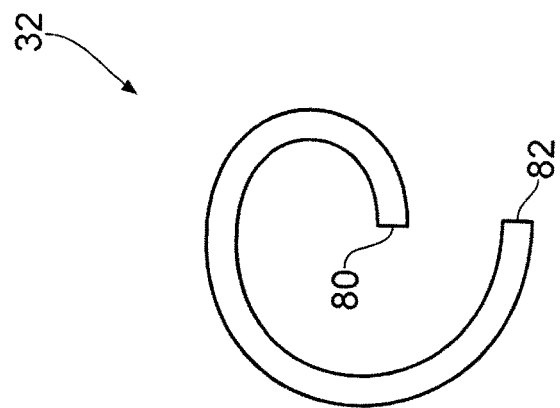
FIG. 3A illustrates a plan view diagram of a first conductor of an apparatus according to various embodiments of the invention.
Figure 4:
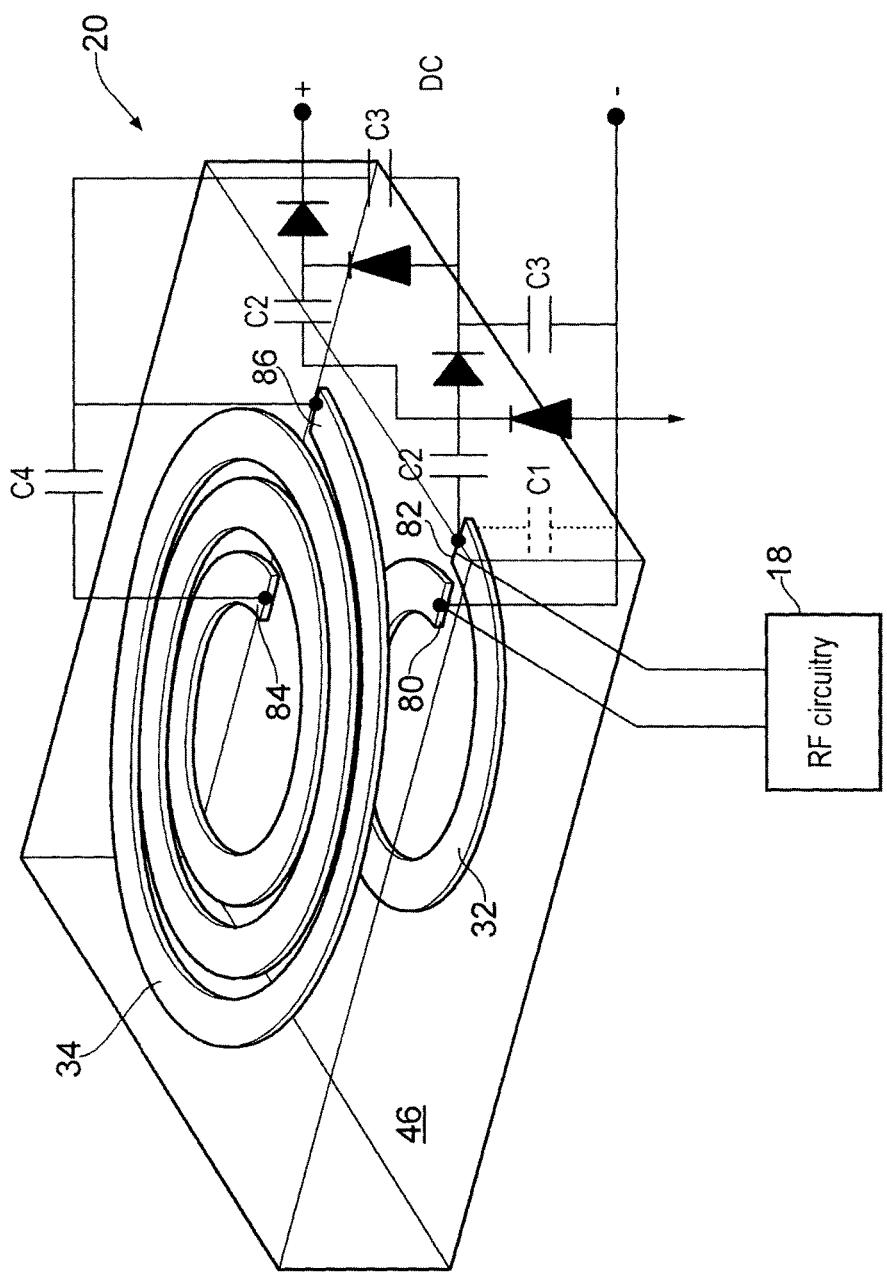
FIG. 4 illustrates a perspective view diagram of an apparatus including the first and second conductors illustrated in FIGS. 3A and 3B.

FIG. 3A illustrates a plan view diagram of a first conductor 32 of an apparatus 16 according to various embodiments of the invention. The first conductor 32 has a first end 80 and a second end 82 and defines a spiral shape having one turn. The first end 80 and the second end 82 are coupled to the radio frequency circuitry 18. Additionally, the first end 80 and the second end 82 are coupled to the charging circuitry 20 (that is, the ends 80, 82 are connected to the charging circuitry 20 and also in parallel to the radio frequency circuitry 18 as illustrated in FIG. 4). The first conductor 32 has a first electrical length and resonates at the operational frequency band of radio frequency identification high frequency (RFID HF). It should be appreciated that the first electrical length may include one or more reactive components such as an inductor in addition to the physical length of the first conductor 32.

FIG. 3B illustrates a plan view diagram of a second conductor 34 of an apparatus 16 according to various embodiments of the invention. The second conductor 34 has a first end 84 and a second end 86 and defines a spiral shape having three turns. The first end 84 and the second end 86 are coupled to the charging circuitry 20 (as illustrated in FIG. 4). The second conductor 34 may electromagnetically couple to/from the first conductor 32 whilst at least one end of the second conductor 34 is coupled to a ground plane (that is, the second conductor 34 parasitically couples to the first conductor 32). The second conductor 34 has a second electrical length and resonates at the operational frequency band of radio frequency identification high frequency (RFID HF) (13.56 MHz). It should be appreciated that the second electrical length may include one or more reactive components in addition to the physical length of the second conductor 34.

The first conductor 32 and/or the second conductor 34 may be used as an RFID coupling element and may be used to harvest energy electromagnetically. The first and second conductors 32, 34 may increase the energy harvesting abilities of the apparatus 16 for near field communication where both conductors are configured to operate in the same operational frequency band (for example, RFID HF 13.56 MHz or Qi 100 kHz). Where the first conductor 32 and the second conductor 34 as illustrated in FIGS. 3A and 3B are used in an apparatus 16 together, they are positioned so that the inner turn of the second conductor 34 is positioned so that it at least partially overlaps the first conductor 32.

It should be appreciated that the first conductor 32 and the second conductor 34 are conductors that have some intrinsic and mutual inductance. For example, the second conductor 34 has sufficient intrinsic inductance to function as described in the preceding paragraphs and there is sufficient mutual inductance between the first and second conductors 32 and 34 to enable them to function as described in the preceding paragraphs.

FIG. 4 illustrates a perspective view diagram of an apparatus including the first and second conductors 32, 34 illustrated in FIGS. 3A and 3B. Similarly to the apparatus illustrated in FIG. 2, the electrolyte layer 46 is sandwiched between the first and second conductors 32, 34. The DC output of the charging circuitry 20 may be a load circuit or the electric double layer capacitor 30.

In some examples, the apparatus 16 is configured to harvest energy using the Qi (100 kHz) charging system. The first conductor 32 may additionally form a high frequency antenna and may be configured to operate in a far field operational frequency band such as WLAN/BT (2.4 GHz) or may be an LTE Rx diversity antenna.

Figure 5:
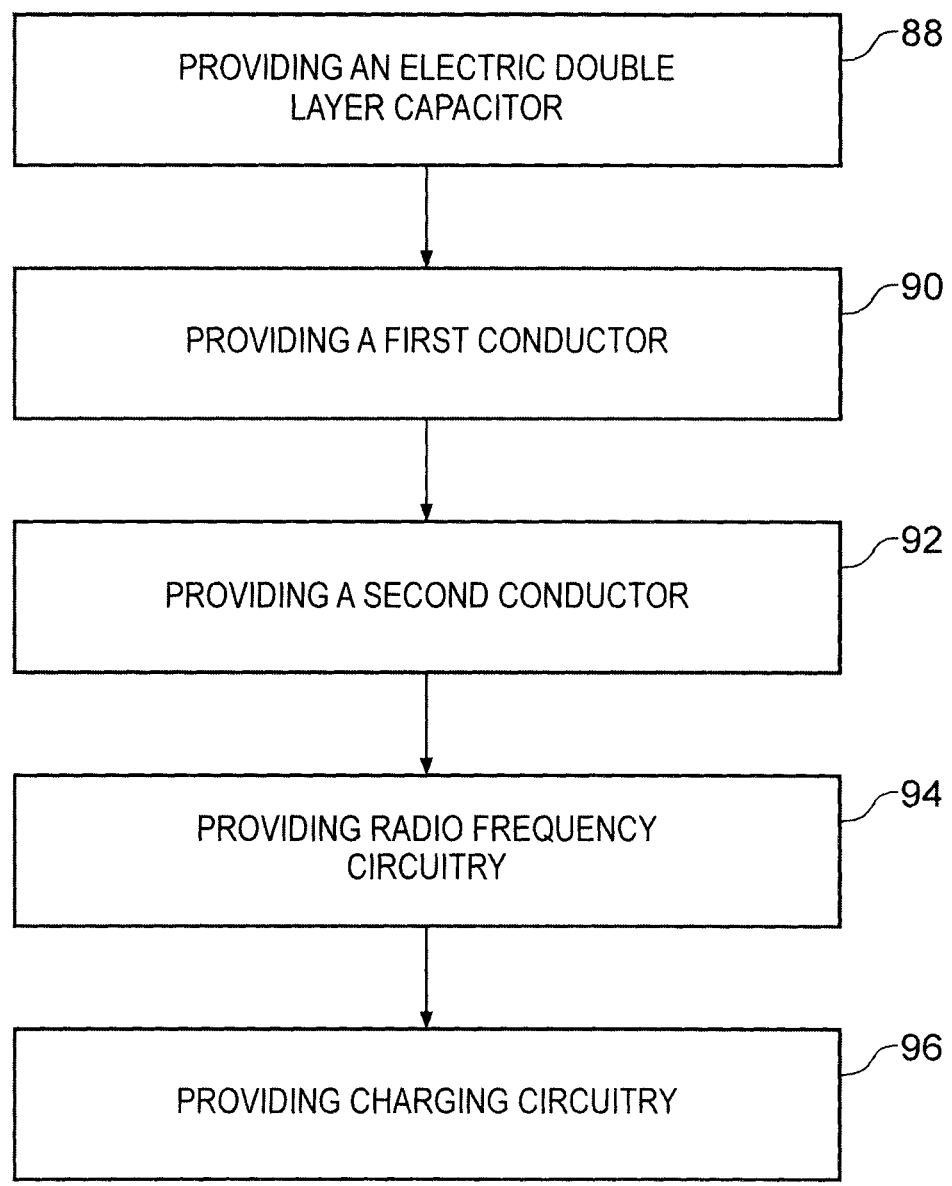
FIG. 5 illustrates a flow diagram of a method according to various embodiments of the invention.

FIG. 5 illustrates a flow diagram of a method according to various embodiments of the invention. At block 88, the method includes providing an electric double layer capacitor 30.

At block 90, the method includes providing a first conductor 32 adjacent a first surface 40 of the electric double layer capacitor 30. In some embodiments, block 90 may additionally include providing a first flexible printed circuit 36 which includes the first conductor 32.

At block 92, the method includes providing a second conductor 34 adjacent a second surface 42 of the electric double layer capacitor 30. In some embodiments, block 92 may additionally include providing a second flexible printed circuit 38 which includes the second conductor 34.

At block 94, the method includes providing radio frequency circuitry 18 and connecting the radio frequency circuitry 18 to the first conductor 32 and/or the second conductor 34.

At block 96, the method includes providing charging circuitry 20 and connecting the charging circuitry 20 to the first conductor 32 and to the second conductor 34.

The blocks illustrated in the FIG. 5 may represent steps in a method and/or sections of code in a computer program. For example, a controller may use the computer program to control machinery to perform the method illustrated in FIG. 4. The illustration of a particular order to the blocks does not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed. For example, the first conductor 32 and the second conductor 34 may be non-planar and where they have a spiral shape, each turn of the spiral may be positioned in a different plane.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. Apparatus comprising:
    a supercapacitor, comprising an electrolyte and a first surface and a second surface, the first surface being opposite the second surface;
    a first printed circuit including a first conductor configured to operate as a first antenna, configured at least for wireless communication by transferring data bits wirelessly, positioned adjacent the first surface and configured to function as a current collector for the supercapacitor, and having a first electrical length to resonate in a first operational frequency band;
    a second printed circuit including a second conductor configured to operate as a second antenna, positioned adjacent the second surface and configured to function as a current collector for the supercapacitor, the second conductor having a second electrical length to resonate in a second operational frequency band, wherein the supercapacitor is sandwiched between the first printed circuit and the second printed circuit, wherein the first antenna and the second antenna are configured to function simultaneously as antennas and as current collectors for the supercapacitor, wherein the first electrical length and the second electrical length are different and wherein the second conductor is galvanically isolated from the first conductor;
    and charging circuitry configured to charge the supercapacitor via the first conductor and the second conductor;
    wherein the first operational frequency band and the second operational frequency band are configured to one of partially overlap in frequency and not overlap in frequency.

2. Apparatus as claimed in claim 1, wherein the first operational frequency band includes a near field communication (NFC) frequency band, a Qi frequency band, or a far field frequency band.

3. Apparatus as claimed in claim 1, wherein the first conductor and the second conductor are coils having at least one turn.

4. Apparatus as claimed in claim 1, further comprising a first flexible printed circuit including the first conductor, and a second flexible printed circuit including the second conductor, the supercapacitor being sandwiched between the first flexible printed circuit and the second flexible printed circuit.

5. Apparatus as claimed in claim 1, further comprising radio frequency circuitry configured to provide signals to, and/or receive signals from, the first conductor.

6. Apparatus as claimed in claim 1, further comprising radio frequency circuitry configured to provide signals to, and/or receive signals from, the second conductor.

7. A portable electronic device comprising apparatus as claimed in claim 1.

8. A portable electronic device as claimed in claim 7, wherein the portable electronic device is flexible.

9. A module comprising apparatus as claimed in claim 1.

10. An electronic device comprising the apparatus of claim 1, wherein the apparatus is configured to charge the electronic device in addition to being configured at least for wireless communication by transferring data bits wirelessly.

11. An electronic device comprising the apparatus of claim 1, wherein the apparatus of claim 1 is configured to charge further electronic devices external to the electronic device, in addition to being configured for wireless communication by transferring data bits wirelessly.

12. A method comprising:
providing a supercapacitor, comprising an electrolyte and a first surface and a second surface, the first surface being opposite the second surface;
providing a first printed circuit including a first conductor configured to operate as a first antenna, configured at least for wireless communication by transferring data bits wirelessly, positioned adjacent the first surface and configured to function as a current collector for the supercapacitor, and having a first electrical length to resonate in a first operational frequency band;
providing a second printed circuit including a second conductor configured to operate as a second antenna, positioned adjacent the second surface and configured to function as a current collector for the supercapacitor, the second conductor having a second electrical length to resonate in a second operational frequency band, wherein the supercapacitor is sandwiched between the first printed circuit and the second printed circuit, wherein the first antenna and the second antenna are configured to function simultaneously as antennas and as current collectors for the supercapacitor, wherein the first electrical length and the second electrical length are different and wherein the second conductor is galvanically isolated from the first conductor;
and further providing charging circuitry configured to charge the supercapacitor via the first conductor and the second conductor;
wherein the first operational frequency band and the second operational frequency band are configured to one of partially overlap in frequency and not overlap in frequency.

13. A method as claimed in claim 12, further comprising providing a first flexible printed circuit including the first conductor, and providing a second flexible printed circuit including the second conductor, the supercapacitor being sandwiched between the first flexible printed circuit and the second flexible printed circuit.

14. A method as claimed in claim 12, further comprising providing radio frequency circuitry configured to provide signals to, and/or receive signals from, the first conductor.

* * * * *